(12) United States Patent
Liu (10) Patent No.: US 10,037,060 B2
(45) Date of Patent: Jul. 31, 2018

(54) DEVICE FOR HOLDING POWER AND HOLDER THEREOF

(71) Applicant: WISTRON CORP., New Taipei (TW)

(72) Inventor: Meng-Chieh Liu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 15/060,373

(22) Filed: Mar. 3, 2016

(65) Prior Publication Data
    US 2017/0156230 A1    Jun. 1, 2017

(30) Foreign Application Priority Data
    Nov. 27, 2015    (TW) ................. 104139702

(51) Int. Cl.
    | | |
    |---|---|
    | G06F 1/18 | (2006.01) |
    | H01M 2/10 | (2006.01) |
    | G07F 19/00 | (2006.01) |
    | H05K 7/12 | (2006.01) |
    | F16B 21/07 | (2006.01) |

(52) U.S. Cl.
    CPC ............ *G06F 1/188* (2013.01); *G07F 19/205* (2013.01); *H01M 2/105* (2013.01); *H01M 2/1022* (2013.01); *H01M 2/1055* (2013.01); *H05K 7/12* (2013.01); *F16B 21/071* (2013.01)

(58) Field of Classification Search
    CPC .. H01M 1/1016; H01M 1/1022; H01M 1/105; H01M 1/1055; H01M 1/1061; H01M 1/1066; H01M 10/643; H01M 10/647; H01M 2/1016; H01M 2/1022; H01M 2/105; H01M 2/1055; H01M 2/1061; H01M 2/1066; H04M 1/0262; G06F 1/1635; G06F 1/1658; G06F 1/188
    USPC ......................... 248/313, 500, 505; 429/100; 361/679.01–679.6
    See application file for complete search history.

(56) References Cited

U.S. PATENT DOCUMENTS

| | | | | |
|---|---|---|---|---|
| 4,863,812 A | * | 9/1989 | Ueda .................. | H01M 2/1022 429/100 |
| 5,926,545 A | * | 7/1999 | Wu ..................... | H04M 1/0262 379/433.08 |
| 6,751,103 B1 | * | 6/2004 | Sivertsen ............ | H01M 2/1016 361/825 |
| 6,764,788 B2 | * | 7/2004 | Robertson, Jr. ..... | H01M 2/0404 429/100 |

(Continued)

*Primary Examiner* — Jonathan Liu
*Assistant Examiner* — Guang H Guan
(74) *Attorney, Agent, or Firm* — Maschoff Brennan (57) ABSTRACT

A holder includes a support, a back plate and a holding member. The back plate includes a main portion connected to the support, and a positioning portion movably connected to the main portion to either at a blocking position or an unblocking position. The holding member is disposed between the positioning portion and the support. Two ends of the holding member opposite to each other are connected to the main portion. The holding member and the main portion jointly define an accommodation space. When the positioning portion is at the blocking position, the positioning portion partially protrudes from the main portion and blocks a side of the accommodation space. When the positioning portion is at the unblocking position, the positioning portion does not protrude from the main portion, and the positioning portion unblocks the side of the accommodation space.

8 Claims, 12 Drawing Sheets

(56) References Cited

U.S. PATENT DOCUMENTS

| | | | | |
|---|---|---|---|---|
| 6,786,462 | B1* | 9/2004 | Bland | B60R 15/00 |
| | | | | 248/505 |
| 7,638,231 | B2* | 12/2009 | Kurosawa | H01M 2/1055 |
| | | | | 429/100 |
| 8,562,036 | B2* | 10/2013 | Zhou | H01M 2/1061 |
| | | | | 292/256 |
| 2006/0198115 | A1* | 9/2006 | Chen | G06F 1/184 |
| | | | | 361/796 |
| 2007/0298319 | A1* | 12/2007 | Barwick | H01M 2/1055 |
| | | | | 429/100 |
| 2010/0047678 | A1* | 2/2010 | Chung | H01M 2/1066 |
| | | | | 429/100 |
| 2011/0159338 | A1* | 6/2011 | Li | H01M 2/105 |
| | | | | 429/100 |
| 2013/0059188 | A1* | 3/2013 | Lu | H01M 2/1066 |
| | | | | 429/100 |
| 2013/0115502 | A1* | 5/2013 | Zhou | H01M 2/10 |
| | | | | 429/100 |
| 2013/0115503 | A1* | 5/2013 | Zhou | H01M 2/1022 |
| | | | | 429/100 |
| 2013/0168518 | A1* | 7/2013 | Lu | G06F 1/188 |
| | | | | 248/309.1 |
| 2014/0185213 | A1* | 7/2014 | Chai | G06F 1/181 |
| | | | | 361/679.02 |
| 2015/0228944 | A1* | 8/2015 | Lin | H01M 2/1066 |
| | | | | 429/100 |
| 2017/0156230 | A1* | 6/2017 | Liu | H05K 7/12 |

\* cited by examiner

DEVICE FOR HOLDING POWER AND HOLDER THEREOF

CROSS-REFERENCE TO RELATED APPLICATIONS

This non-provisional application claims priority under 35 U.S.C. § 119(a) on Patent Application No(s). 104139702 filed in Taiwan R.O.C. on Nov. 27, 2015, the entire contents of which are hereby incorporated by reference.

TECHNICAL FIELD

The present disclosure provides a holder and a device for holding power source, more particular to a holder for a power source and a device having the holder.

BACKGROUND

Generally, an electronic device, such as a laptop, a personal computer, a server or an automated teller machine (ATM), is equipped with a power supply. The power supply is used for supplying power to the electronic device. The electronic device may be equipped with an additional backup power source for maintaining stability and security of the electronic device. For example, the backup power source allows the ATM to keep working in power failures.

SUMMARY

According to the disclosure, a holder includes a support, a back plate and a holding member. The back plate includes a main portion and a positioning portion. The main portion is connected to the support, and the positioning portion is movably connected to the main portion to be either at a blocking position or an unblocking position. The holding member is disposed between the positioning portion and the support. Two ends of the holding member that are opposite to each other are connected to the main portion. The holding member and the main portion jointly define an accommodation space. When the positioning portion of the back plate is at the blocking position, a part of the positioning portion protrudes from the main portion and blocks a side of the accommodation space. When the positioning portion is at the unblocking position, the positioning portion does not protrude from the main portion, and the positioning portion unblocks the side of the accommodation space.

According to the disclosure, a device for holding a power source includes a case and the aforementioned holder. The accommodation space defined by holding member and the main portion is for accommodating the power source. When the positioning portion of the back plate is at the blocking position, the positioning portion positions the power source in the accommodation space. When the positioning portion is at the unblocking position, the power source is detachable from the accommodation space.

BRIEF DESCRIPTION OF THE DRAWINGS

The present invention will become more understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
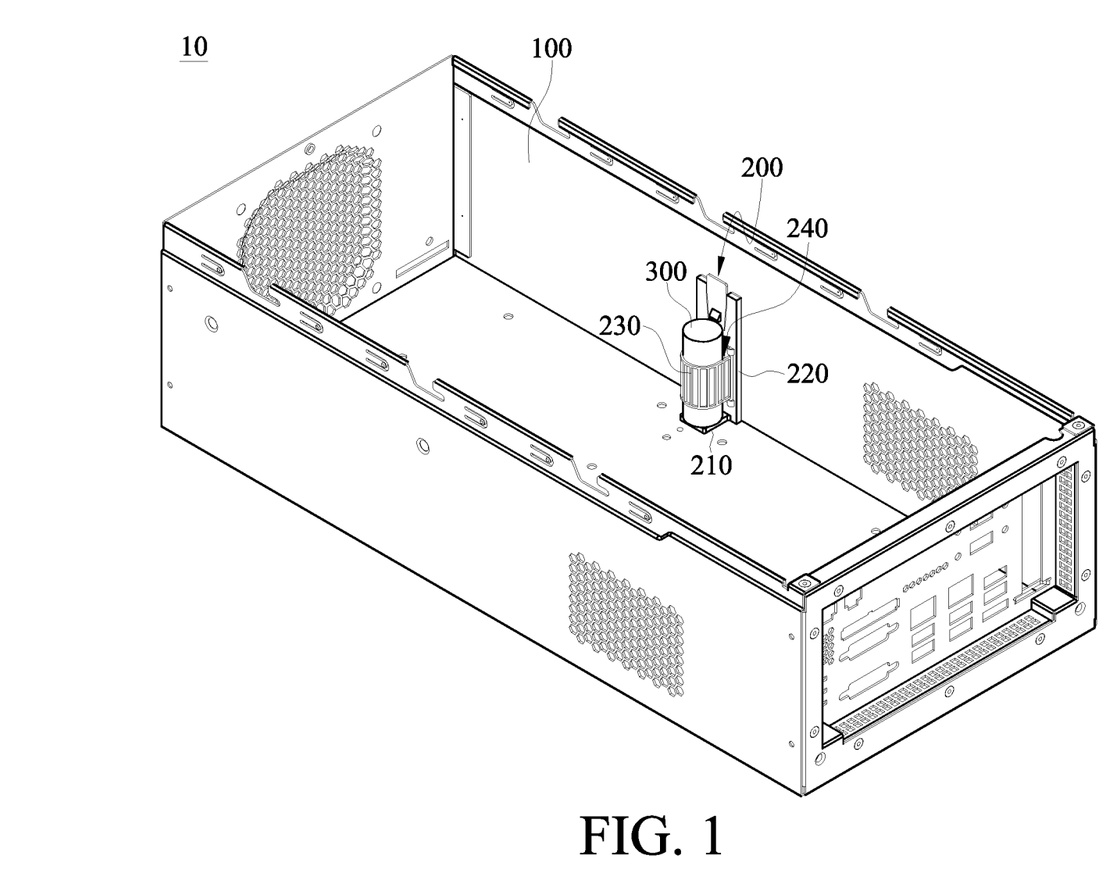
FIG. 1 is a perspective view of a device for holding power source according to a first embodiment.
Figure 2:
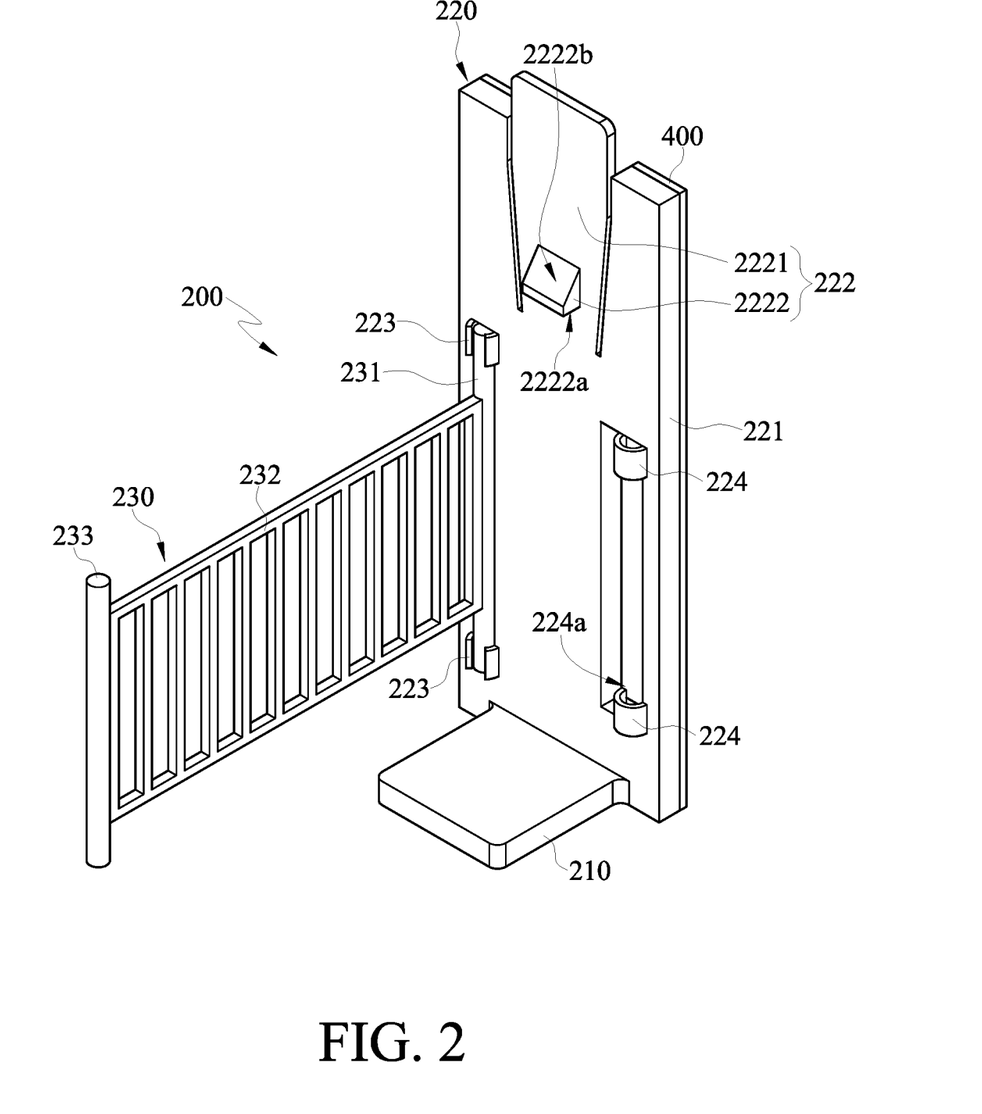
FIG. 2 is a perspective view of a holder in FIG. 1.
Figure 3:
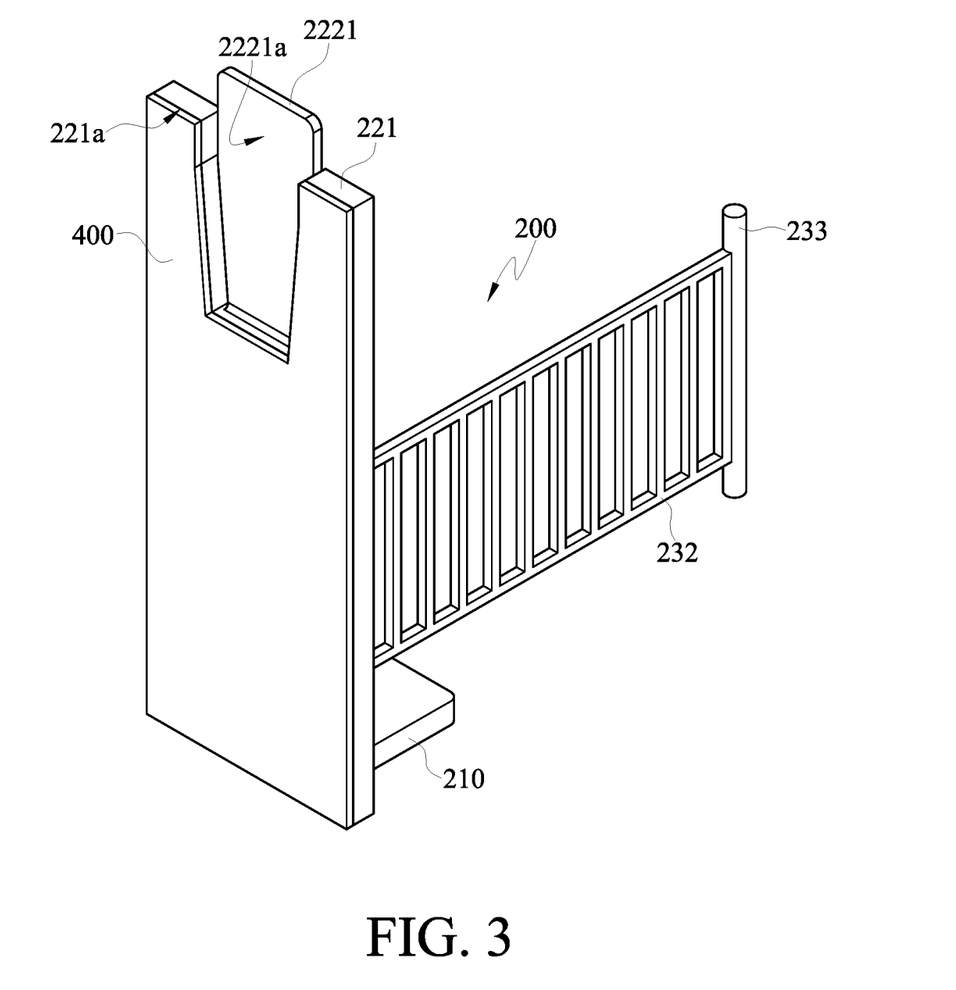
FIG. 3 is another perspective view of the holder in FIG. 2.
Figure 4:
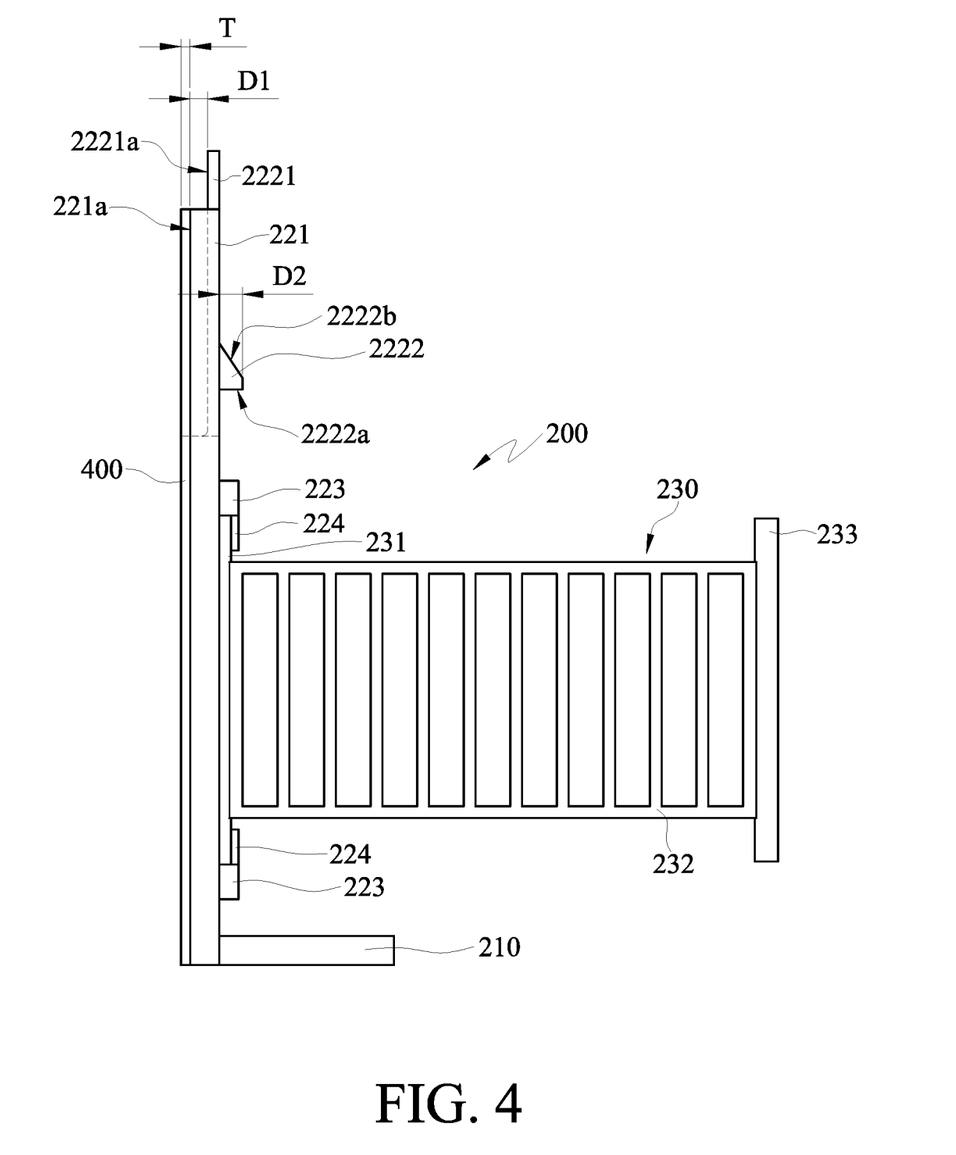
FIG. 4 is a side view of the holder in FIG. 2.
Figure 5:
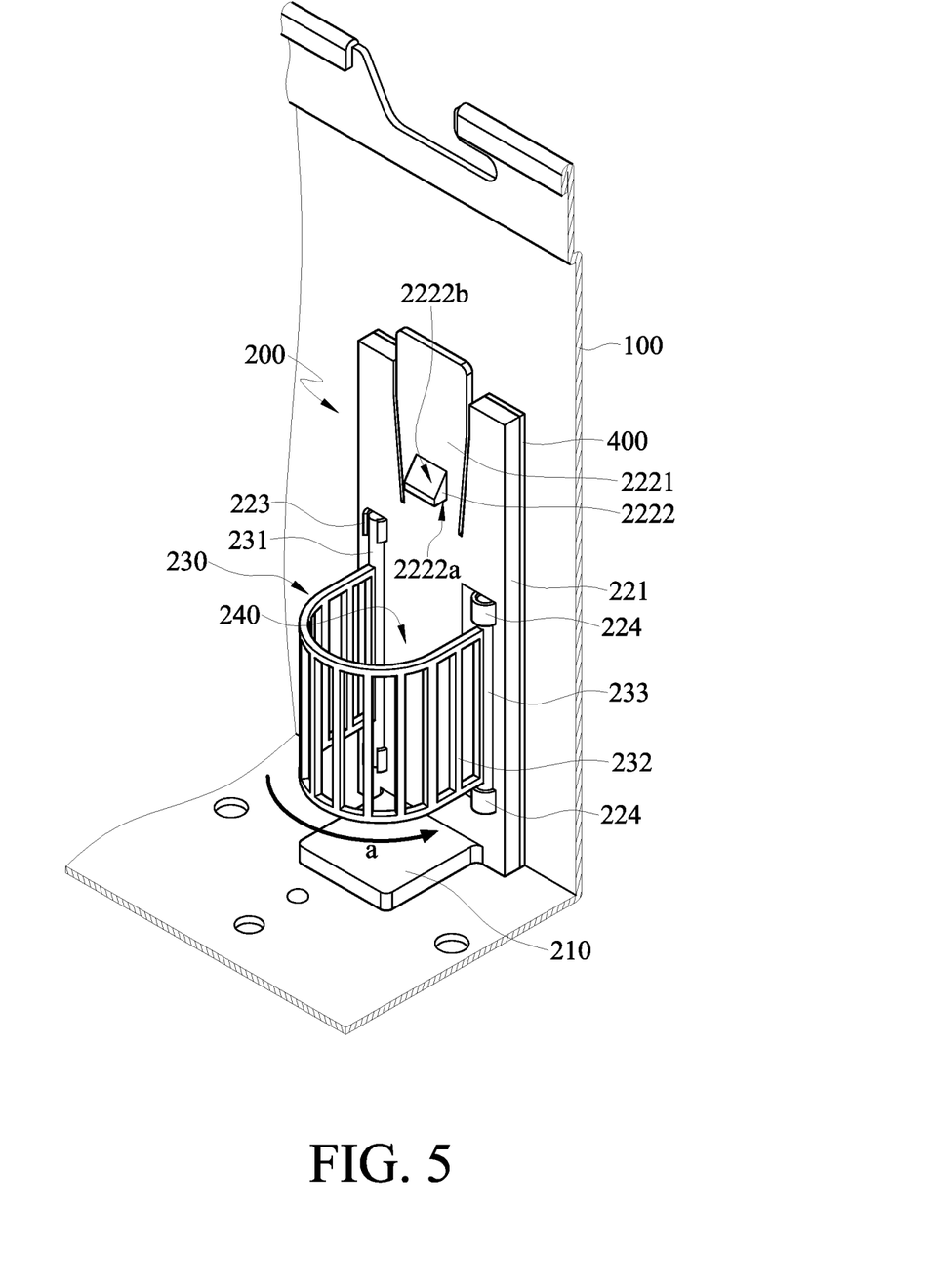
FIG. 5 is a perspective view of the holder with a holding member fastened to a back plate.

Please refer to FIG. 1 to FIG. 5. FIG. 1 is a perspective view of a device for providing power according to a first embodiment. FIG. 2 is a perspective view of a holder in FIG. 1. FIG. 3 is another perspective view of the holder in FIG. 2. FIG. 4 is a side view of the holder in FIG. 2. FIG. 5 is a perspective view of the holder with a holding member fastened to a back plate. In this embodiment, a device 10 for holding power source is provided. The device 10 is, for example applicable to an ATM for providing electric power to the ATM. The device 10 includes a case 100, a holder 200, a power source 300 and an adhesive member 400.

The holder 200 is, for example, made of plastic material which has high electric insulation and low cost. The plastic holder 200 also has flat surfaces and smooth edges so as to prevent the plastic holder 200 from scratching the nearby cables and electric members. The holder 200 is disposed to the case 100 and includes a support 210, a back plate 220 and a holding member 230.

Figure 7:
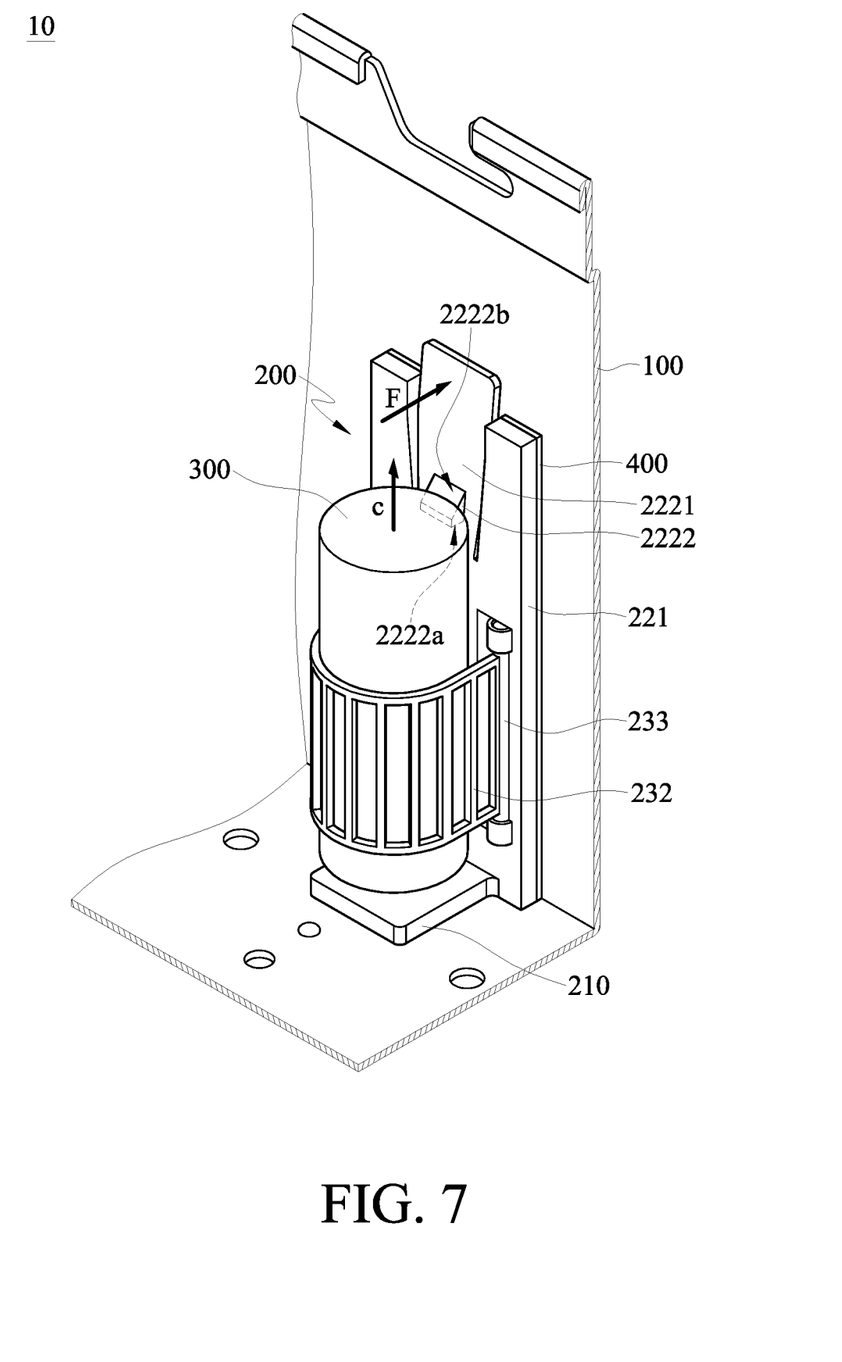

The back plate 220 includes a main portion 221 and a positioning portion 222. The main portion 221 is connected to the support 210. The positioning portion 222 includes a flexible part 2221 and a protrusion 2222. The flexible part 2221 is connected to the main portion 221. The protrusion 2222 protrudes from a surface of the flexible part 2221. The protrusion 2222 has a fastening surface 2222a and an inclined surface 2222b. The fastening surface 2222a faces the support 210. The inclined surface 2222b is opposite to the fastening surface 2222a. The flexible part 2221 is movably connected to the main portion 221, and the positioning portion 222 has a blocking position (as shown in FIG. 2) and an unblocking position (as shown in FIG. 7). In this embodiment, the flexible part 2221 is rotatable relative to the main portion 221 so that the positioning portion 222 has the blocking position and the unblocking position. The support 210 is integral with the main portion 221 of the back plate 220, but the disclosure is not limited thereto. In other embodiments, the support 210 and the main portion 221 can be two separable members, and the support 210 is adhered or fastened to the main portion 221.

The holding member 230 is disposed between the protrusion 2222 of the positioning portion 222 and the support 210. Two ends of the holding member 230 that are opposite to each other are connected to the main portion 221 of the back plate 220. The holding member 230 and the main portion 221 jointly define an accommodation space 240.

The back plate 220 further includes two pivotal slots 223 and two fastening slots 224. The pivotal slots 223 and the fastening slots 224 are respectively disposed on two sides of the main portion 221 that are opposite to each other. The fastening slot 224 has an opening 224a facing the pivotal slot 223. The holding member 230 includes a pivotal pin 231, a flexible strip 232 and a fastening pin 233. The flexible strip 232 is connected between the pivotal pin 231 and the fastening pin 233. The pivotal pin 231 is slidably disposed in and pivoted to the pivotal slots 223 of the back plate 220. The fastening pin 233 is detachably fastened to the fastening slots 224. In detail, the fastening pin 233 is able to be fastened into the fastening slots 224 or alternatively removed from the fastening slots 224 through the opening 224a. When the fastening pin 233 is fastened to the fastening slots 224, the flexible strip 232 and the main portion 221 jointly define the accommodation space 240 (as shown in FIG. 1 to FIG. 5). The present disclosure is not limited to the quantity of the pivotal slots 223 and the fastening slots 224. Both the number of the pivotal slots 223 and that of the fastening slots 224 can be altered according to actual requirement. In other embodiments, the quantity of the pivotal slot 223 can be one, and the quantity of the fastening slot 224 can be one.

The power source 300 is, for example, a cylindrical shaped battery or a prismatic shaped battery. The power source 300 is detachably disposed in the accommodation space 240. In this embodiment, the power source 300 is drawable from the accommodation space 240 along a vertical direction parallel to the normal line of the top surface of the support 210.

The adhesive member 400 is, for example, a foam tape. The adhesive member 400 is for adhering the main portion 221 of the back plate 220 to the case 100. In detail, the main portion 221 has a first surface 221a opposite to the accommodation space 240. Two sides of the adhesive member 400 which are opposite to each other are respectively adhered to the first surface 221a and the case 100. Therefore, the adhesive member 400 is favorable for a user to rapidly adhere the holder to the case 100.

Furthermore, the flexible part 2221 of the back plate 220 has a second surface 2221a opposite to the accommodation space 240. As shown in FIG. 4, the second surface 2221a is closer to the accommodation space 240 than the first surface 221a, and the second surface 2221a is spaced apart from the first surface 221a by a first distance D1. When the positioning portion 222 is at the blocking position, the protrusion 2222 protrudes from a surface of the main portion 221 by a second distance D2, and a sum of the first distance D1 and a thickness T of the adhesive member 400 is greater than or equal to the second distance D2.

Figure 6:
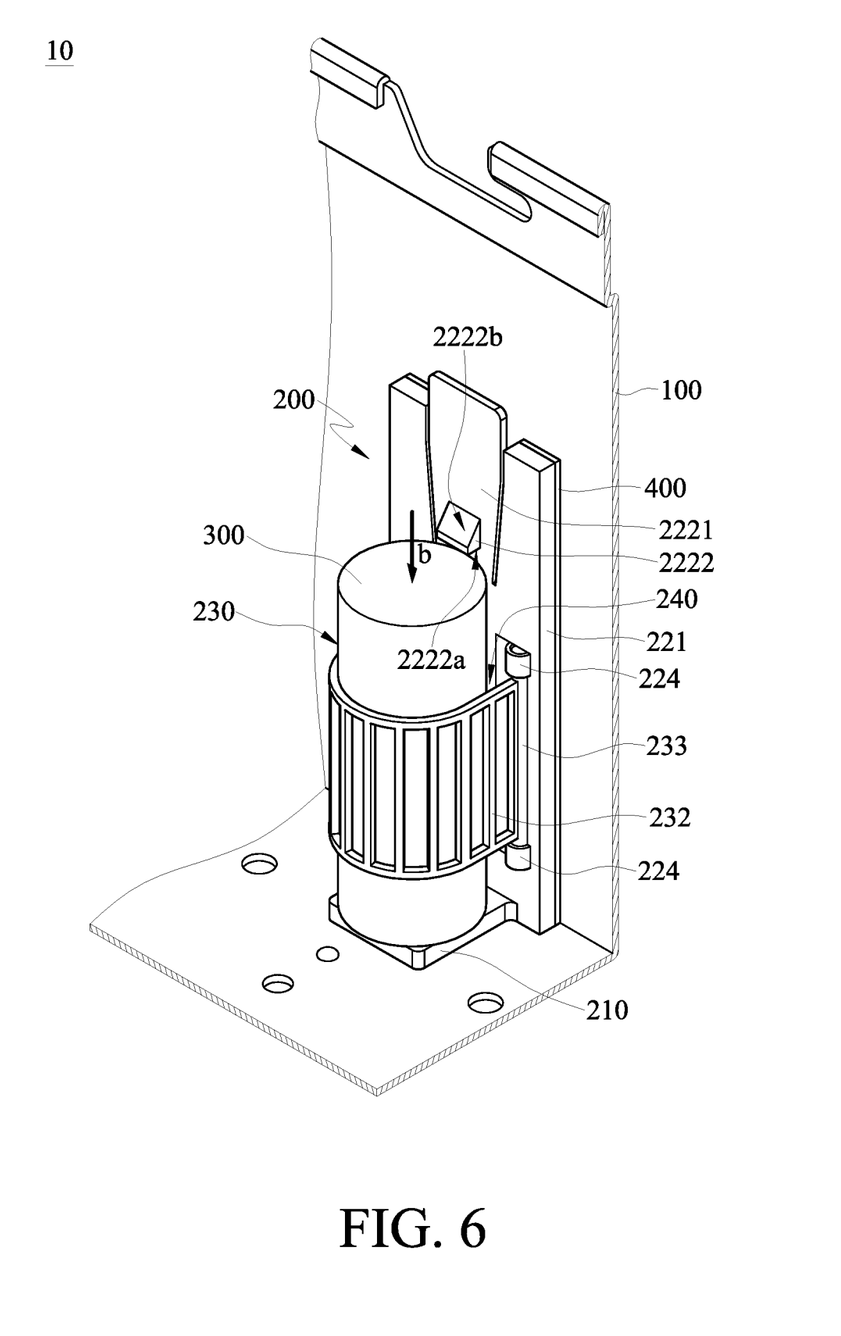
FIG. 6 and FIG. 7 are perspective views of the holder in FIG. 5 with a power source disposed in an accommodation space.

The following illustrates a method for fastening a power source in the holder 200. Please refer to FIG. 2 and FIG. 5 to FIG. 7. FIG. 6 and FIG. 7 are perspective views of the holder in FIG. 5 with a power source disposed in an accommodation space.

As shown in FIG. 2 and FIG. 5, the holder 200 is adhered to the case 100 by the adhesive member 400. A user is able to bend the flexible strip 232 of the holding member 230 along a direction A and fasten the fastening pin 233 into the fastening slot 224 through the opening 224a. There is no external force applied on the positioning portion 222 so that the protrusion 2222 keeps being protruded from the surface of the main portion 221.

As shown in FIG. 6, the user is able to dispose a power source 300 in the accommodation space 240 along a direction B. The power source 300 presses the inclined surface 2222b of the protrusion 2222 so as to bend the flexible part 2221, and thereby the positioning portion 222 is moved from the blocking position to the unblocking position (as shown in FIG. 7). When the power source 300 is located in the accommodation space 240, the power source 300 no longer presses the protrusion 2222 of the positioning portion 222 so that the flexible part 2221 automatically returns to its original status. That is, the positioning portion 222 returns to the blocking position by its elastic energy. When the positioning portion 222 is at the blocking position, the protrusion 2222 of the positioning portion 222 protrudes from the surface of the main portion 221, the protrusion 2222 is able to block a side of the accommodation space 240 so as to position the power source 300. In detail, the power source 300 is constrained by the flexible strip 232 and the main portion 221 in the horizontal direction, and the power source 300 is constrained by the support 210 and the protrusion 2222 in a horizontal direction perpendicular to the normal line of the top surface of the support 210. Therefore, the power source 300 is fastened in the accommodation space 240. In this embodiment, since the opening 224a of the fastening slot 224 faces the pivotal slot 223, the movement of the fastening pin 233 is constrained by the power source 300 so as to prevent the fastening pin 233 from being accidentally removed from the fastening slot 224.

As shown in FIG. 7, when the user wants to remove the power source 300 from the accommodation space 240, the user is able to apply an external force F on the flexible part 2221 so as to bend the flexible part 2221 to move the positioning portion 222 to the unblocking position. When the positioning portion 222 is at the unblocking position, the protrusion 2222 of the positioning portion 222 does not protrude from the surface of the main portion 221, thus the protrusion 2222 unblocks the side of the accommodation space 240 and remove the constraint to the power source 300. Therefore, the user is able to draw the power source 300 from the accommodation space 240 along a direction C.

According to this embodiment of the disclosure, the positioning portion 222 is favorable for simplifying the steps of assembling the power source 300. To fasten the power source 300 to the holder 200, the user only needs to fasten the holding member 230 to the back plate 220 and dispose the power source 300 in the accommodation space 240. Moreover, the installation of the power source 300 is executed after the installation of the holding member 230 so that the power source 300 is prevented from affecting the assembly of the holding member 230, thereby improving the convenience of assembling the device 10.

In this embodiment, the power source 300 is disposed to the holder 200 after the holder is adhered to the case 100, but the disclosure is not limited thereto. In other embodiments, if the case 100 has compact size, the power source 300 can be disposed to the holder 200 before the holder is adhered to the case 100.

Figure 8A:
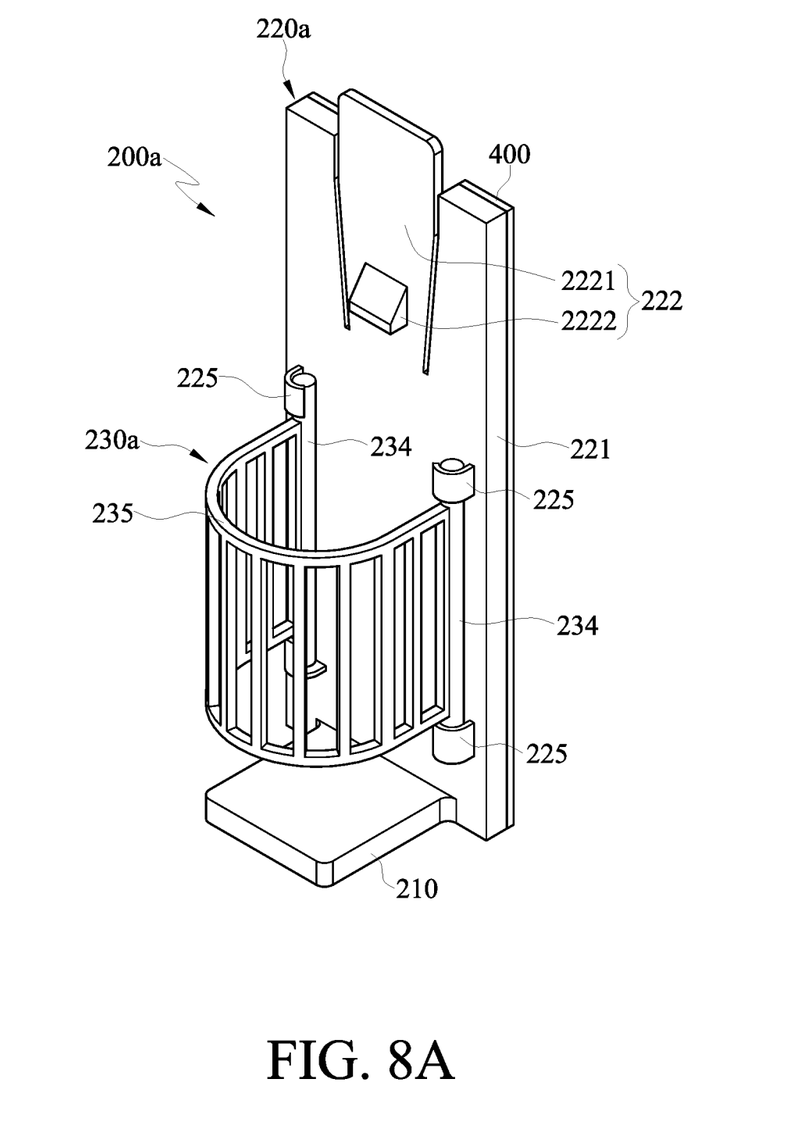
FIG. 8A is a perspective view of a holder according to a second embodiment.
Figure 8B:
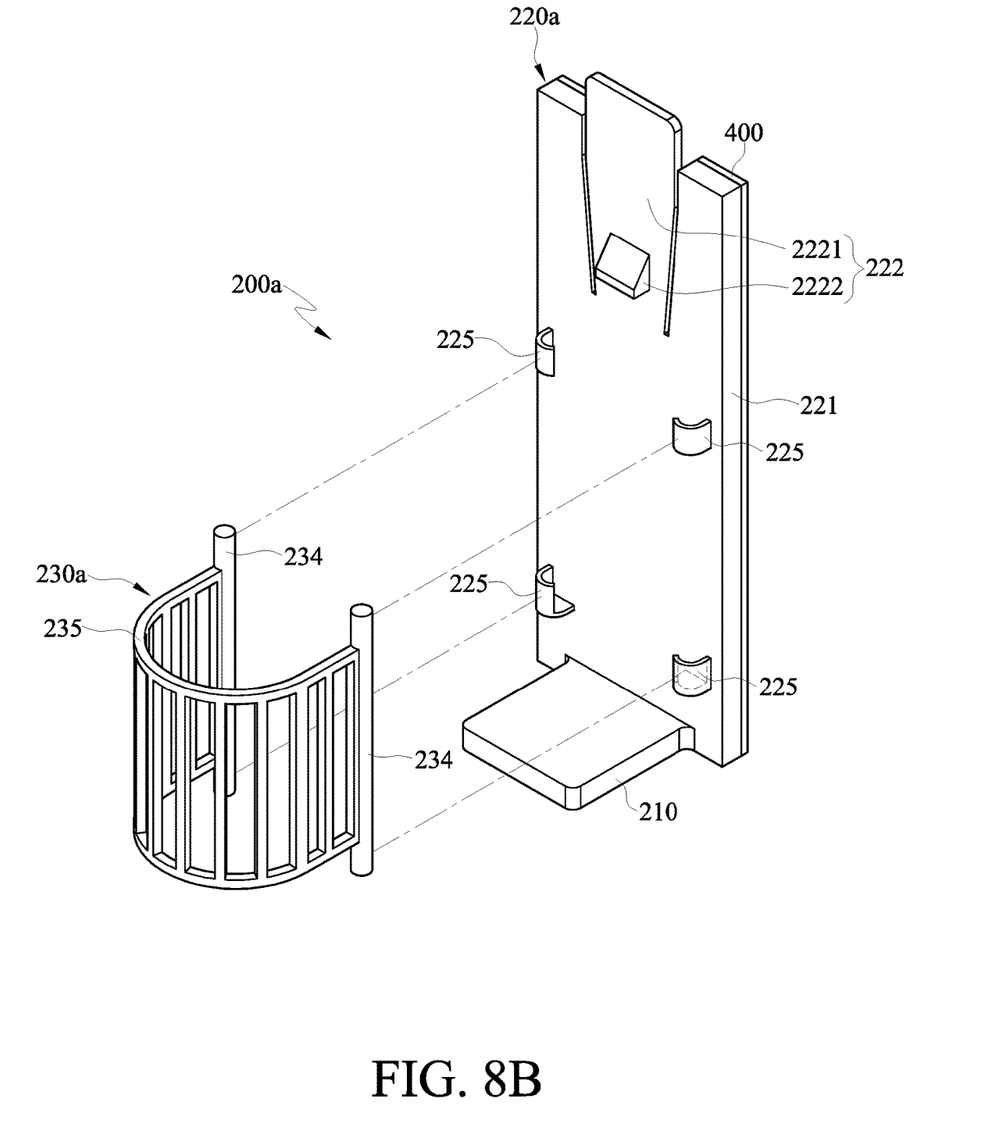
FIG. 8B is an exploded view of the holder in FIG. 8A.

In the first embodiment, one end of the holding member is pivoted to the back plate 220 while the other end is fastened to the back plate 220, but the disclosure is not limited thereto. Please refer to FIG. 8A and FIG. 8B. FIG. 8A is a perspective view of a holder according to a second embodiment. FIG. 8B is an exploded view of the holder in FIG. 8A. Since the second embodiment is similar to the first embodiment, only the differences will be illustrated hereafter. The holder 200a includes a support 210, a back plate 220a and a holding member 230a.

The back plate 220a includes a main portion 221, a positioning portion 222 and four slots 225. The main portion 221 of the back plate 220a is connected to the support 210. The positioning portion 222 of the back plate 220a includes a flexible part 2221 and a protrusion 2222. The flexible part 2221 of the positioning portion 222 is connected to the main portion 221. The protrusion 2222 may protrude from the flexible part 2221. Two slots 225 are disposed to a side of the main portion 221, and the other two slots 225 are disposed to opposite side of the main portion 221.

The holding member 230a is disposed between the protrusion 2222 of the positioning portion 222 and the support 210. The holding member 230a includes two pins 234 and a flexible strip 235. The flexible strip 235 is connected to the two pins 234. One of the pins 234 is fastened to or assembled together with two of the four slots 225, and the other pin 234 is fastened to or assembled together with the other two slots 225.

Figure 9A:
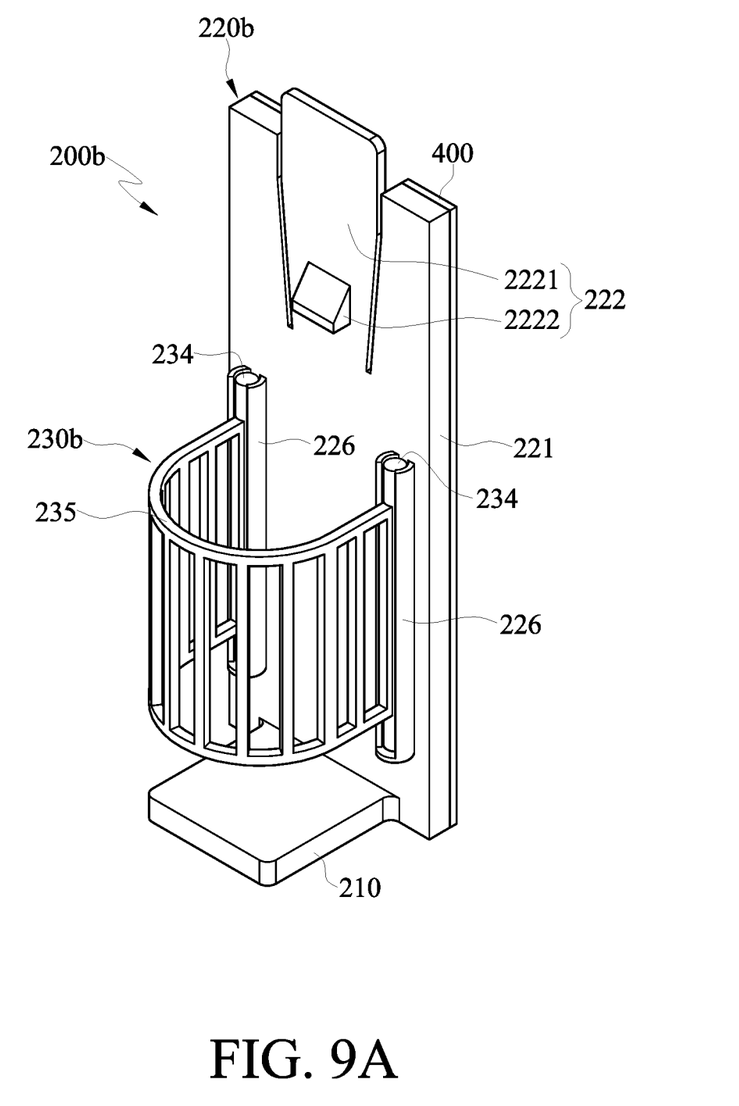
FIG. 9A is a perspective view of a holder according to a third embodiment.
Figure 9B:
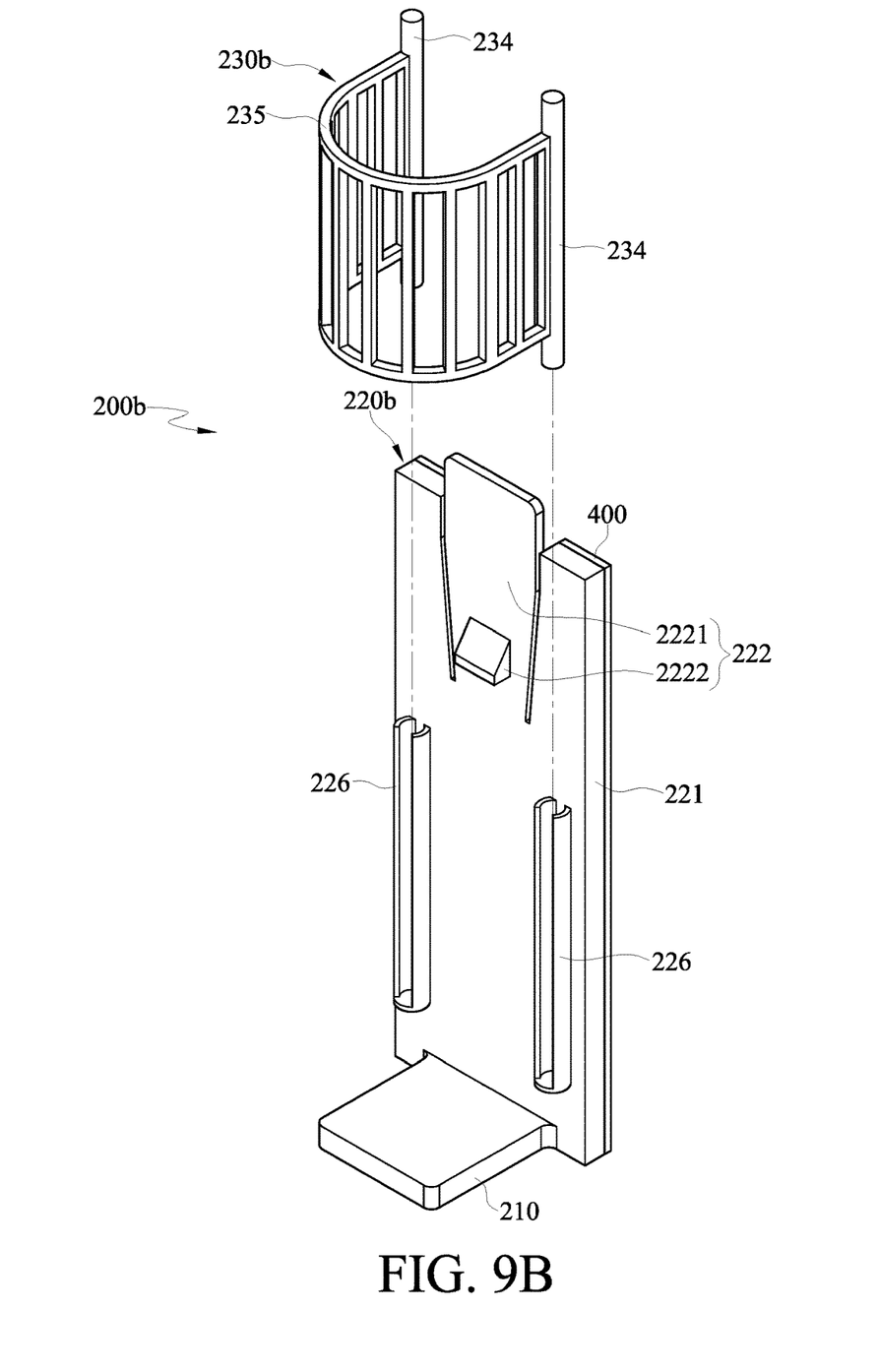
FIG. 9B is an exploded view of the holder in FIG. 9A.

Please refer to FIG. 9A and FIG. 9B. FIG. 9A is a perspective view of a holder according to a third embodiment. FIG. 9B is an exploded view of the holder in FIG. 9A. Since the third embodiment is similar to the second embodiment, only the differences will be illustrated hereafter. The holder 200b includes a support 210, a back plate 220b and a holding member 230b.

The back plate 220b includes a main portion 221, a positioning portion 222 and two slots 226. The main portion 221 of the back plate 220b is connected to the support 210. The positioning portion 222 of the back plate 220b includes a flexible part 2221 and a protrusion 2222. The flexible part 2221 of the positioning portion 222 is connected to the main portion 221. The protrusion 2222 protrudes from a surface of the flexible part 2221. Two slots 226 are respectively disposed to two sides of the main portion 221 which are opposite to each other.

The holding member 230b is disposed between the protrusion 2222 of the positioning portion 222 and the support 210. The holding member 230b includes two pins 234 and a flexible strip 235. The flexible strip 235 is connected to the two pins 234. One of the pins 234 is slidably assembled together with one of the two slots 226, and the other pin 234 is slidably assembled together with the other slot 226.

Figure 10:
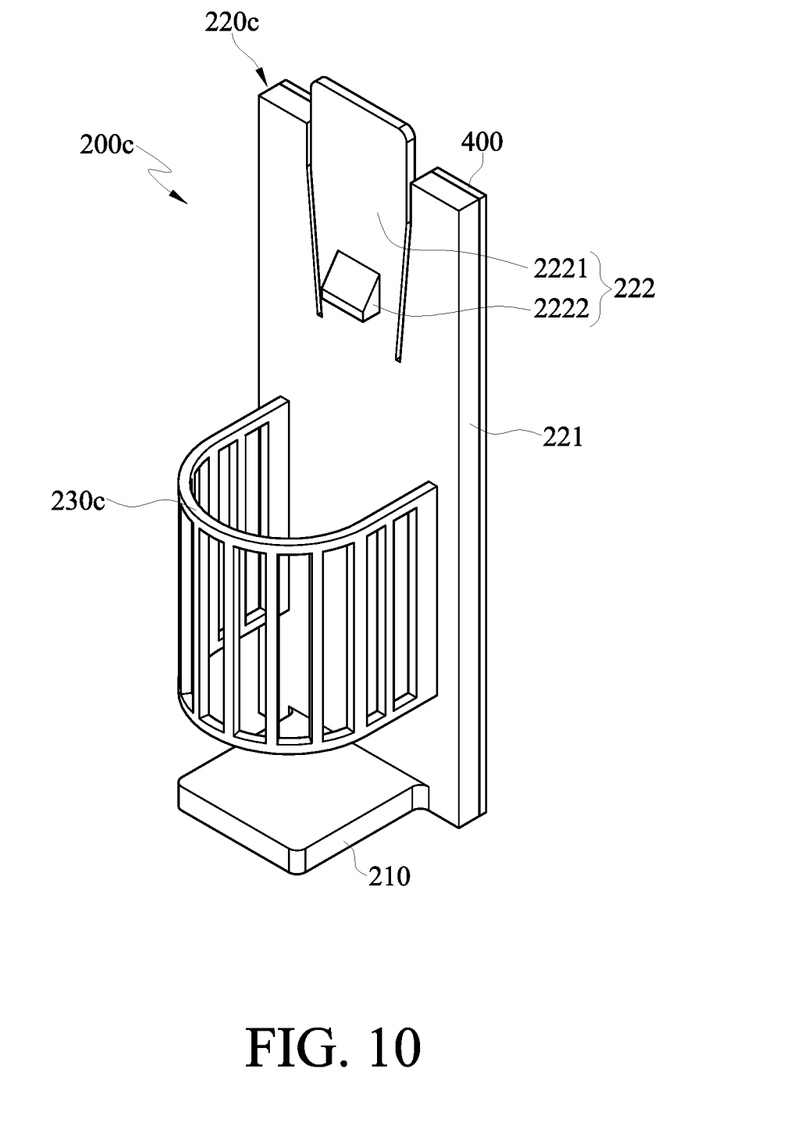
FIG. 10 is a perspective view of a holder according to a fourth embodiment.

Please refer to FIG. 10. FIG. 10 is a perspective view of a holder according to a fourth embodiment. Since the fourth embodiment is similar to the first embodiment, only the differences will be illustrated hereafter. The holder 200c includes a support 210, a back plate 220c and a holding member 230c.

The back plate 220c includes a main portion 221 and a positioning portion 222. The main portion 221 of the back plate 220c is connected to the support 210. The positioning portion 222 of the back plate 220c includes a flexible part 2221 and a protrusion 2222. The flexible part 2221 of the positioning portion 222 is connected to the main portion 221, and the protrusion 2222 protrudes from a surface of the flexible part 2221.

The holding member 230c is disposed between the protrusion 2222 of the positioning portion 222 and the support 210. In this embodiment, the holding member 230c is integral with the main portion 221 of the back plate 220c. That is, the back plate 220c and the holding member 230c are a single member and inseparably connected to each other.

Compared to the first through the third embodiments, the step of assembling the holding member 230c with the back plate 220c is omitted. Thus, the assembling efficiency is improved. Furthermore, in the third and the fourth embodiments, the flexible strip can be replaced with a C-shaped metal sheet, but the disclosure is not limited thereto.

According to the disclosure, the power source is constrained by the holding member and the main portion in the horizontal direction, and is constrained by the support and the fastening portion in the vertical direction. Therefore, the power source is fastened in the accommodation space for improving the assembly reliability. Furthermore, a part of the positioning portion is bendable, which simplifies the steps of assembling the power source. Therefore, assembly of the power source is easier and faster.

Moreover, the opening of the fastening slot faces the pivotal slot of the back plate so that the fastening pin in the accommodation space is constrained by the power source, thereby preventing the fastening pin from being accidentally removed from the fastening slot.

In addition, the holder is made of plastic material which has high electric insulation and low cost. The plastic holder also has flat and smooth surfaces so as to prevent the plastic holder from scratching the nearby cables and electric members.

The foregoing description, for the purpose of explanation, has been described with reference to specific embodiments; however. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

What is claimed is:
1. A holder, comprising:
a support;
a back plate comprising a main portion and a positioning portion, the main portion being connected to the support, the positioning portion including a flexible part and a protrusion that protrudes from the flexible part, the flexible part being movably connected to the main portion so that the positioning portion is either at a blocking position or an unblocking position; and
a holding member disposed between the positioning portion and the support, two ends of the holding member that are opposite to each other connected to the main portion, the holding member and the main portion jointly defining an accommodation space, the main portion having a front surface facing the accommodation space;
wherein:
when the positioning portion is at the blocking position, the protrusion extends from the flexible part forward of a plane defined by the front surface of the main portion so as to be positioned to prevent movement of an object from the accommodation space;
when the positioning portion is at the unblocking position, the flexible part is retracted such that a portion of the protrusion is disposed behind the plane defined by the front surface of the main portion so as to enable movement of the object from the accommodation space, and the back plate further comprises a pivotal slot and a fastening slot, each of the pivotal slot and the fastening slot comprises a recessed portion formed in the front surface of the main portion, the recessed portions of the pivotal slot and the fastening slot are respectively disposed on two sides of the main portion that are opposite to each other, the holding member comprises a pivotal pin, a flexible strip and a fastening pin, the flexible strip is connected between the pivotal pin and the fastening pin, the pivotal pin is pivotally coupled to the pivotal slot, the fastening pin is detachably fastened to the fastening slot, and the flexible strip and the main portion jointly define the accommodation space.

2. The holder according to claim 1, wherein the protrusion of the positioning portion has a fastening surface and an inclined surface, the fastening surface is facing the support, and the inclined surface is opposite to the fastening surface.

3. The holder according to claim 1, wherein the main portion has a first surface opposite to the accommodation space, the flexible part has a second surface opposite to the accommodation space, the second surface is closer to the accommodation space than the first surface, and the second surface is spaced apart from the first surface.

4. The holder according to claim 1, further comprising an adhesive member, wherein the main portion of the back plate has a first surface opposite to the accommodation space, and the adhesive member is adhered to the first surface.

5. A device, comprising:
a case;
a holder, comprising:
  a support;
  a back plate comprising a main portion and a positioning portion, the main portion being connected to the support, the positioning portion including a flexible part and a protrusion that protrudes from the flexible part, the flexible part being movably connected to the main portion so that the positioning portion is either at a blocking position or an unblocking position; and
  a holding member disposed between the positioning portion and the support, two ends of the holding member that are opposite to each other respectively connected to the main portion, the holding member and the main portion jointly defining an accommodation space, the main portion having a front surface facing the accommodation space; and
a power source detachably disposed in the accommodation space;
wherein:
  when the positioning portion of the back plate is at the blocking position, the protrusion extends from the flexible part forward of a plane defined by the front surface of the main portion so as to be positioned to prevent movement of the power source from the accommodation space;
  when the positioning portion is at the unblocking position, the flexible part is retracted such that a portion of the protrusion is disposed behind the plane defined by the front surface of the main portion so as to enable movement of the power source from the accommodation space, and
  the back plate further comprises a pivotal slot and a fastening slot, each of the pivotal slot and the fastening slot comprises a recessed portion formed in the front surface of the main portion, the recessed portions of the pivotal slot and the fastening slot are respectively disposed on two sides of the main portion that are opposite to each other, the holding member comprises a pivotal pin, a flexible strip and a fastening pin, the flexible strip is connected between the pivotal pin and the fastening pin, the pivotal pin is pivotally coupled to the pivotal slot, the fastening pin is detachably fastened to the fastening slot, and the flexible strip and the main portion jointly define the accommodation space.

6. The device according to claim 5, wherein the protrusion of the positioning portion has a fastening surface and an inclined surface, the fastening surface is facing the support, and the inclined surface is opposite to the fastening surface.

7. The device according to claim 5, wherein the main portion has a first surface opposite to the accommodation space, the flexible part has a second surface opposite to the accommodation space, the second surface is closer to the accommodation space than the first surface, and the second surface is spaced apart from the first surface.

8. The device according to claim 5, further comprising an adhesive member, wherein the main portion of the back plate has a first surface opposite to the accommodation space, and the adhesive member is adhered to the first surface.

* * * * *